US009484182B2

(12) United States Patent
Akima et al.

(10) Patent No.: US 9,484,182 B2
(45) Date of Patent: Nov. 1, 2016

(54) CHARGED-PARTICLE-BEAM DEVICE AND METHOD FOR CORRECTING ABERRATION

(71) Applicant: Hitachi High-Technologies Corporation, Minato-ku, Tokyo (JP)

(72) Inventors: Hisanao Akima, Tokyo (JP); Takaho Yoshida, Tokyo (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 14/422,423

(22) PCT Filed: Aug. 7, 2013

(86) PCT No.: PCT/JP2013/071316
§ 371 (c)(1),
(2) Date: Feb. 19, 2015

(87) PCT Pub. No.: WO2014/041927
PCT Pub. Date: Mar. 20, 2014

(65) Prior Publication Data
US 2015/0235801 A1 Aug. 20, 2015

(30) Foreign Application Priority Data

Sep. 14, 2012 (JP) ................ 2012-202216

(51) Int. Cl.
*H01J 37/00* (2006.01)
*H01J 37/153* (2006.01)
*H01J 37/26* (2006.01)
*H01J 37/10* (2006.01)

(52) U.S. Cl.
CPC .............. *H01J 37/153* (2013.01); *H01J 37/10* (2013.01); *H01J 37/26* (2013.01); *H01J 2237/1534* (2013.01); *H01J 2237/2614* (2013.01)

(58) Field of Classification Search
USPC ....................................... 250/492.3
See application file for complete search history.

(56) References Cited

U.S. PATENT DOCUMENTS

| 7,619,220 | B2 * | 11/2009 | Sawada ............ G01N 23/04 250/306 |
| 7,683,320 | B2 * | 3/2010 | Sannomiya ........... H01J 37/153 250/311 |
| 8,866,078 | B2 * | 10/2014 | Akima ............ H01J 37/153 250/306 |
| 2007/0120055 | A1 | 5/2007 | Sawada et al. |

FOREIGN PATENT DOCUMENTS

JP     2007-180013 A    7/2007

* cited by examiner

*Primary Examiner* — Phillip A Johnston
(74) *Attorney, Agent, or Firm* — Miles & Stockbridge P.C.

(57) ABSTRACT

The present invention provides a method and apparatus for correcting an aberration in a charged-particle-beam device. The apparatus includes a charged-particle-beam source, a charged-particle optical system that irradiates a specimen with charged particles emitted from the charged-particle-beam source, an aberration corrector that corrects an aberration of the charged-particle optical system, a control unit that controls the charged-particle optical system and the aberration corrector, a through-focus imaging unit that obtains plural Ronchigrams in which a focal position of the charged-particle optical system is changed, and an aberration calculation unit that divides the obtained Ronchigram into plural local areas, and calculates the amount of the aberration based on line focuses detected in the local areas.

12 Claims, 11 Drawing Sheets

(A) UNDER-FOCUS SIDE (B) OVER-FOCUS SIDE (A) WHEN FOCUS PITCH WIDTH IS SMALL $f_1$ TRUE LINE FOCUS (UNDER-FOCUS SIDE)

$f_2$ TRUE LINE FOCUS (OVER-FOCUS SIDE)

(B) WHEN FOCUS PITCH WIDTH IS LARGE $f_1'$ DETECTED LINE FOCUS (UNDER-FOCUS SIDE)

$f_2'$ DETECTED LINE FOCUS (OVER-FOCUS SIDE)

CHARGED-PARTICLE-BEAM DEVICE AND METHOD FOR CORRECTING ABERRATION

TECHNICAL FIELD

The present invention relates to a charged-particle-beam device and a method for correcting aberration, and more particularly, to a charged-particle-beam device provided with an aberration corrector.

BACKGROUND ART

In recent years, a charged-particle-beam device such as a transmission electron microscope (TEM) or a scanning transmission electron microscope (STEM), which includes an aberration corrector, has been proposed. The aberration corrector is used for correcting a spherical aberration (Cs) of an objective lens which is a main factor that limits resolution in TEM or STEM. As the aberration corrector, an aberration corrector that includes two multipole lenses that generate a hexapole magnetic field and two axisymmetric lenses (transmission lenses) disposed therebetween is known. Further, Cs of the objective lens is corrected by the aberration corrector.

However, an extra aberration called a parasitic aberration is generated due to imperfection of the aberration corrector, that is, positional shift of each pole that forms the multipole lens, or variation of a magnetic characteristic of a pole material. A third-order or lower-order parasitic aberration that is generated in this way includes a two-fold symmetric first-order astigmatism (A1), a one-fold symmetric second-order coma aberration (B2), a three-fold symmetric second-order astigmatism (A2), a two-fold symmetric third-order stellar aberration (S3), a four-fold symmetric third-order astigmatism (A3), or the like. In adjustment of the aberration corrector, it is necessary to correct these parasitic aberrations in addition to the correction of Cs. The adjustment of the aberration corrector is performed by repeating aberration measurement of quantifying the size of each aberration that remains in the optical system and aberration correction based on the measurement result. A method of the aberration measurement is disclosed in PTL 1, for example.

CITATION LIST

Patent Literature

PTL 1: JP-A-2007-180013

SUMMARY OF INVENTION

Technical Problem

PTL 1 discloses a technique that observes aberration that remains in an optical system as a change in a local area of a Ronchigram. Further, an observer changes a focus in the vicinity of an exact focal position to obtain a Ronchigram where there is no line having directivity at a central part thereof, to thereby correct a two-fold astigmatism. That is, in aberration measurement, a characteristic amount of aberration is extracted from plural electron microscope images obtained by changing the focus or an inclination angle of a beam, and aberration coefficients indicating the size and direction of the aberration are calculated. However, when the aberration is extremely large, since the electron microscope images are greatly distorted, it is difficult to extract the characteristic amount. For example, the two-fold symmetric first-order astigmatism (hereinafter, referred to as A1) and the one-fold symmetric second-order coma aberration (hereinafter, referred to as B2) may be greatly changed according to an operation such as switching of acceleration voltage or specimen exchange. In this case, as shown in PTL 1, if a user observes the change of the electron microscope image while shaking the focus and manually adjusts a deflection amount or the like of electron beams so that characteristic patterns of A1 or B2 are reduced, the following problems occur.

That is, when large A1 and B2 remain, since a distortion amount due to A1 and B2 also becomes large, it is not possible to recognize the change of the characteristic patterns without changing the adjustment amount of A1 and B2 greatly. Thus, an inexperienced user in adjustment is in a state of being incapable of recognizing the change of the patterns, and thus, does not easily perform the adjustment in a correct direction while appropriately determining the magnitude of an adjustment amount of a specific aberration to be corrected. This is because in a state where the change of the patterns is not recognized although images before and after the adjustment are compared with each other, it is not possible to determine whether the adjustment for before and after is correct. An object of the invention is to provide a charged-particle-beam device capable of measuring aberration even in a state where an aberration amount having large values (for example, A1 and B2) that is not easily measured by the related art technique remains.

Solution to Problem

A charged-particle-beam device according to this application includes: a charged-particle-beam source; a charged-particle optical system that irradiates a specimen with charged particles emitted from the charged-particle-beam source; an aberration corrector that corrects an aberration of the charged-particle optical system; a control unit that controls the charged-particle optical system and the aberration corrector; a through-focus imaging unit that obtains a plurality of Ronchigrams in which a focal position of the charged-particle optical system is changed; and an aberration calculation unit that divides the obtained Ronchigram into a plurality of local areas, and calculates the amount of the aberration based on line focuses detected in the local areas.

A charged-particle-beam device according to this application includes: a charged-particle-beam source; a charged-particle optical system that irradiates a specimen with charged particles emitted from the charged-particle-beam source; an aberration corrector that corrects an aberration of the charged-particle optical system; a control unit that controls the charged-particle optical system and the aberration corrector; an input unit through which a setting value is input; a through-focus imaging unit that obtains a plurality of Ronchigrams in which a focal position of the charged-particle optical system is changed; a correction start input unit that receives a start input of an operation of obtaining the plurality of Ronchigrams by the through-focus imaging unit; a status display that displays whether detection of line focuses is successful based on the obtained Ronchigrams; and an aberration corrector that corrects, when the detection of the line focuses is successful, the aberration based on the detected line focuses, in which when the detection of the line focuses is not performed, the aberration corrector transmits an instruction for requesting an input of a setting value again to the input unit, or transmits an instruction for obtaining the plurality of Ronchigrams in which the focal position is changed in a range larger than the range where the focal position is changed to the through-focus imaging unit.

A method for correcting an aberration according to this application is a method for correcting an aberration in a charged-particle-beam device that includes a charged-particle-beam source, a charged-particle optical system that irradiates a specimen with charged particles emitted from the charged-particle-beam source, an aberration corrector that corrects the aberration of the charged-particle optical system, and a control unit that controls the charged-particle optical system and the aberration corrector, the method including: a first step of obtaining a plurality of Ronchigrams in which a focal position of the charged-particle optical system is changed; a second step of dividing the obtained Ronchigram into a plurality of local areas; and a third step of calculating the amount of the aberration based on line focuses detected in the local areas.

Advantageous Effects of Invention

According to the invention, it is possible to correct even aberration that is not easily measured by the related art technique.

DESCRIPTION OF EMBODIMENTS

In embodiments of the invention, plural Ronchigrams obtained by performing through-focusing are used. Each Ronchigram is divided into plural local areas to detect a line focus for each local area, to thereby calculate an off-axis defocus $C1(\tau)$ and an off-axis astigmatism $A1(\tau)$. Further, an aberration coefficient is calculated by a least squares method from $C1(\tau)$ and $A1(\tau)$, and aberration is corrected based on the result. Hereinafter, an embodiment of the invention will be described with reference to the accompanying drawings.

Figure 1:
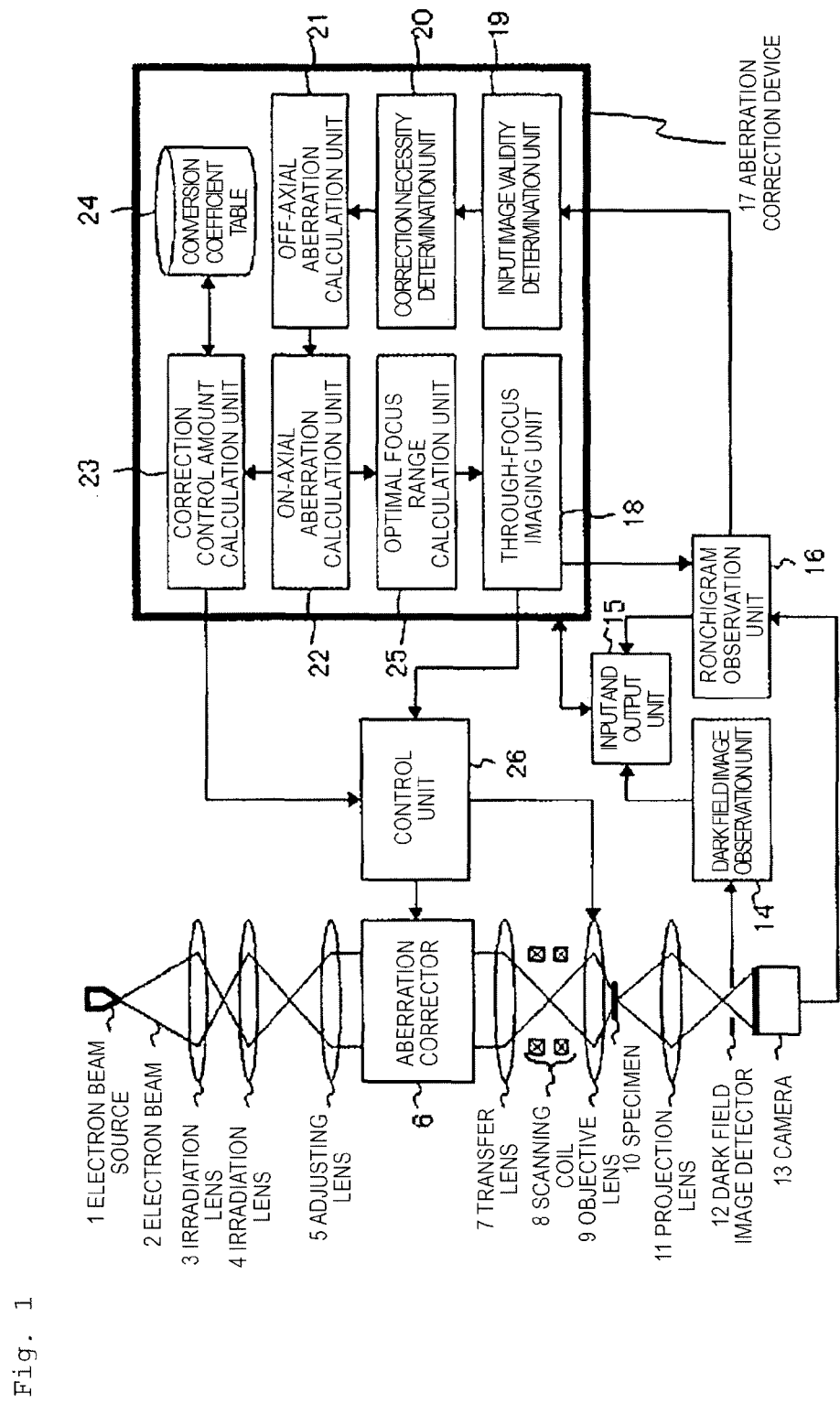
FIG. 1 is a configuration diagram illustrating an example of an embodiment of the invention.

FIG. 1 is a configuration diagram illustrating an example of the embodiment of the invention. In FIG. 1, a scanning transmission electron microscope (STEM) which is a charged-particle-beam device will be described as an example. Electron beams 2 emitted from an electron beam source 1 are subjected to actions of irradiation lenses 3 and 4 to form a focus on an object plane of an adjusting lens 5, and enter an aberration corrector 6 in parallel by an action of the adjusting lens 5. Each aberration of the electron beams 2 is corrected in the aberration corrector 6, and forms a focus above an objective lens 9 by an action of a transfer lens 7. The electron beams 2 of which the aberration is corrected converge by the objective lens 9 to form a fine probe on a specimen 10. Scanning is performed on the specimen 10 using the probe by scanning coils 8. Then, scattered waves coming out of the specimen 10 are received by a dark field image detector 12. Then, the intensity of the scattered waves is displayed as a bright point sequence in an input and output unit 15 in synchronization with the probe scanning by a dark field image observation unit 14, to thereby obtain a dark field image of the specimen 10.

When observing a Ronchigram, the scanning of the electron beam using the scanning coils 8 is stopped, the transmitted and scattered waves coming out of the specimen 10 are received by a camera 13, and a two-dimensional distribution of the intensities of the transmitted and scattered waves are displayed in the input and output unit 15 by the Ronchigram observation unit 16 as the bright point sequence. A projection lens 11 adjusts spreading of the electron beams that enter the dark field image detector 12 and the camera 13.

An automatic aberration correction device 17 includes a through-focus imaging unit 18, an input image validity determination unit 19, a correction necessity determination unit 20, an off-axial aberration calculation unit 21, an on-axial aberration calculation unit 22, a correction control amount calculation unit 23, a conversion coefficient table 24, and an optimal focus range calculation unit 25. The through-focus imaging unit 18 gives an instruction to the Ronchigram observation unit 16 to import a Ronchigram as an input to the automatic aberration correction device 17 while changing the focus by changing excitation of the objective lens 9 through a control unit 26.

The input image validity determination unit 19 determines the validity of the Ronchigram image-captured using Ronchigrams having different focuses, specifically, whether the Ronchigram is image-captured in a region where the specimen is present. The correction necessity determination unit 20 determines whether it is necessary to perform the correction according to the present embodiment from the degree of distortion of the Ronchigram in order to avoid unnecessary correction.

The off-axial aberration calculation unit 21 divides each of the plural Ronchigrams obtained by the through-focusing into plural local areas, and detects a line focus for each local area, to thereby calculate the off-axial defocus $C1(\tau)$ and the off-axial astigmatism $A1(\tau)$. The on-axial aberration calculation unit 22 calculates an aberration coefficient by the least squares method from the $C1(\tau)$ and $A1(\tau)$.

The correction control amount calculation unit 23 calculates a control amount of each lens for correcting the aberration with reference to the conversion coefficient table 24 from the aberration coefficients calculated by the on-axial aberration calculation unit 22, and outputs the control amount to the control unit 26. The optimal focus range calculation unit 25 calculates an optimal through-focus range and an optimal focus pitch width from the aberration coefficients calculated by the on-axial aberration calculation unit 22. Here, it is not necessary that the focus pitch width is constantly uniform in the through-focus range. The interval of the focus-pitch width may be changed according to a line focus condition.

Figure 2:
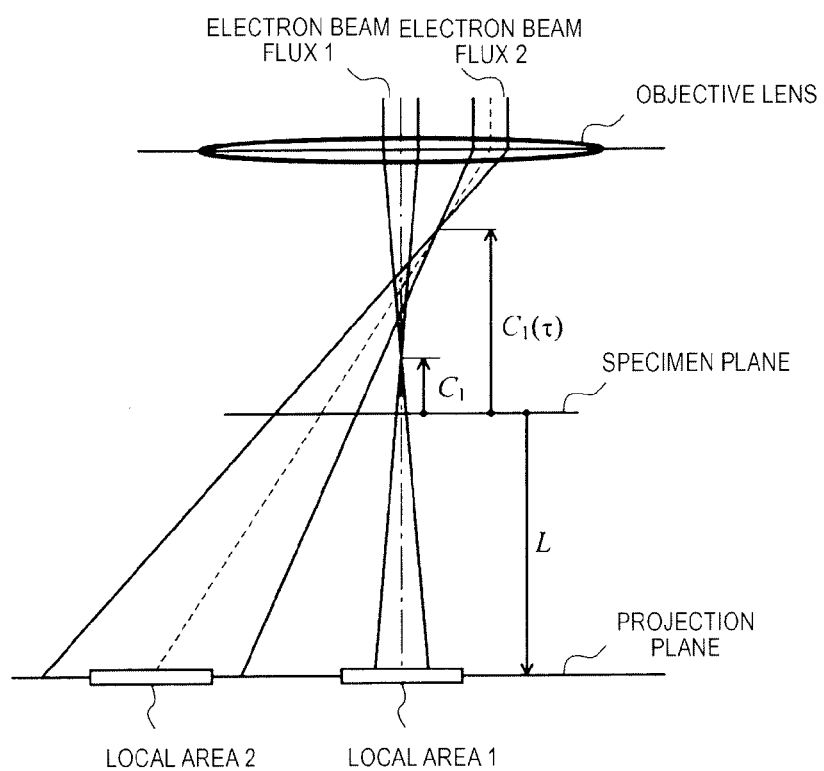
FIG. 2 is a diagram illustrating the relationship between a Ronchigram and an off-axial defocus.

Here, the relationship between the Ronchigram and the off-axial defocus will be described with reference to FIG. 2. When considering an electron beam flux 1 that passes through the vicinity of the on-axis, and an electron beam flux 2 that passes through an outer part of the objective lens, since the electron beam that passes through the outer part of the lens is strongly bent due to the influence of a spherical aberration Cs, the electron beam flux 2 converges on a front side compared with the electron beam flux 1. The height of the focus formed by the electron beam flux 1, that is, on-axial light beams is an on-axial defocus C1, and the height of the focus formed by the electron beam flux 2, that is, off-axial light beams is an off-axial defocus $C1(\tau)$.

Here, when two-dimensional coordinates of a point at which the center (broken line in FIG. 2) of the off-axial light beam intersects a projection plane (central point in a local area) are (u, v), $\tau$ is u+iv (i is a unit imaginary number). When a distance between a specimen surface and the projection plane (detection surface of a camera) is L (L can be changed by excitation of the projection lens 11), the magnification of a projection image of a specimen created in a local area 1 by the electron beam flux 1 is M1=(C1+L)/C1, and the magnification of a projection image of the specimen created in a local area 2 by the electron beam flux 2 is M2=C1($\tau$)+L)/C1($\tau$). Generally, since the relationship of L>>C1 and L>>C1($\tau$) is established, M1≅L/C1, and M2≅L/C1($\tau$). That is, the projection image of the specimen observed in each local area has a magnification that is inversely proportional to a local defocus (on-axial defocus in the case of on-axis, and off-axial defocus in the case of off-axis).

Figure 3:
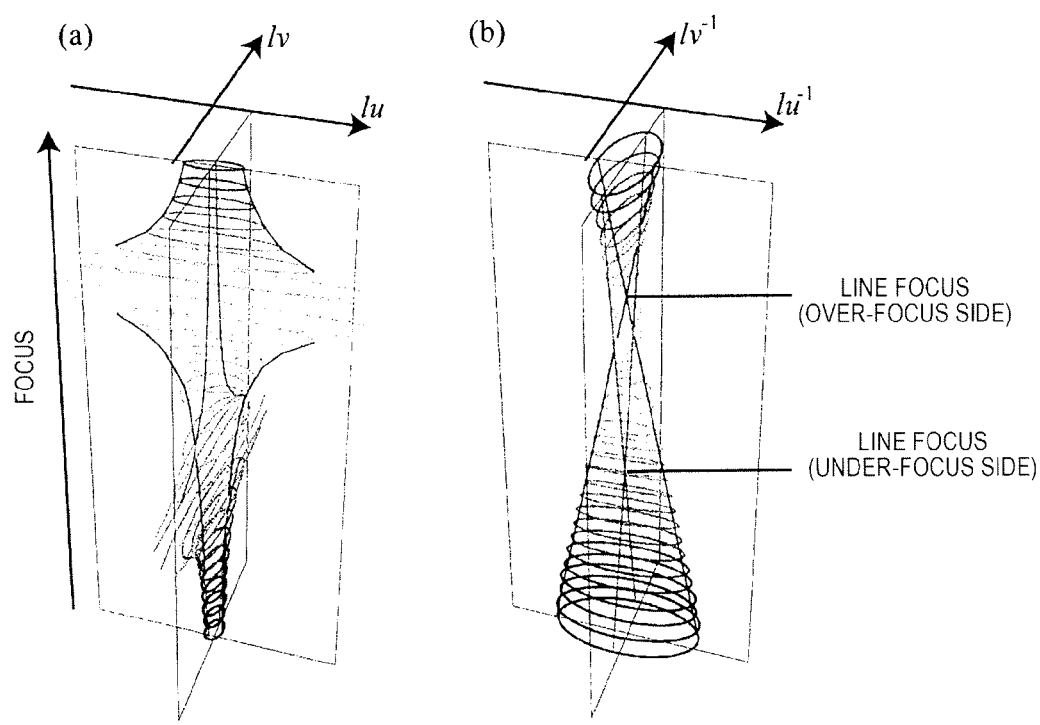
FIG. 3 is a diagram illustrating the relationship between a local autocorrelation function of a Ronchigram and an off-axial astigmatism.

Next, the relationship between an autocorrelation function in a local area of a Ronchigram (hereinafter, referred to as a local autocorrelation function) and an off-axial astigmatism will be described with reference to FIG. 3. FIG. 3(a) shows iso-intensity lines of local autocorrelation functions when through-focusing is performed (when a focus is changed in plural states over a specific region). Here, lu and lv represent local coordinates where a central point of a local area is the origin. The size of an ellipse formed by the iso-intensity line of the local autocorrelation function is proportional to the projection magnification of the local area.

As described above, since the projection magnification of the local area is inversely proportional to the defocus, an envelope of the iso-intensity line in a plane lu=0 and a plane lv=0 is changed in a form that is proportional to −1 power of the focus. Here, when taking a reciprocal of the iso-intensity line coordinates, as shown in FIG. 3(b), the envelope of the iso-intensity line becomes a straight line. In the plane lu=0 and the plane lv=0, positions where the envelopes form focuses are different from each other, and the ellipses formed by the iso-intensity lines when the focus is formed in one plane become linear (hereinafter, referred to as a line focus).

The line focus appears at two places on an under-focus side and an over-focus side with an exact focus being interposed therebetween, which represents a state where the focus is formed on one axis. An interval (astigmatic difference) of the focuses at two places represents the size $|A1(\tau)|$ of the off-axial astigmatism. That is, when the focus amounts when the line focus is formed are represented as f1 (under-focus side) and f2 (over-focus side), $|A1(\tau)|$ is expressed by Formula (1).

$$|A_1(\tau)| = \frac{1}{2}(f_2 - f_1)$$ [Formula 1]

Figure 4:
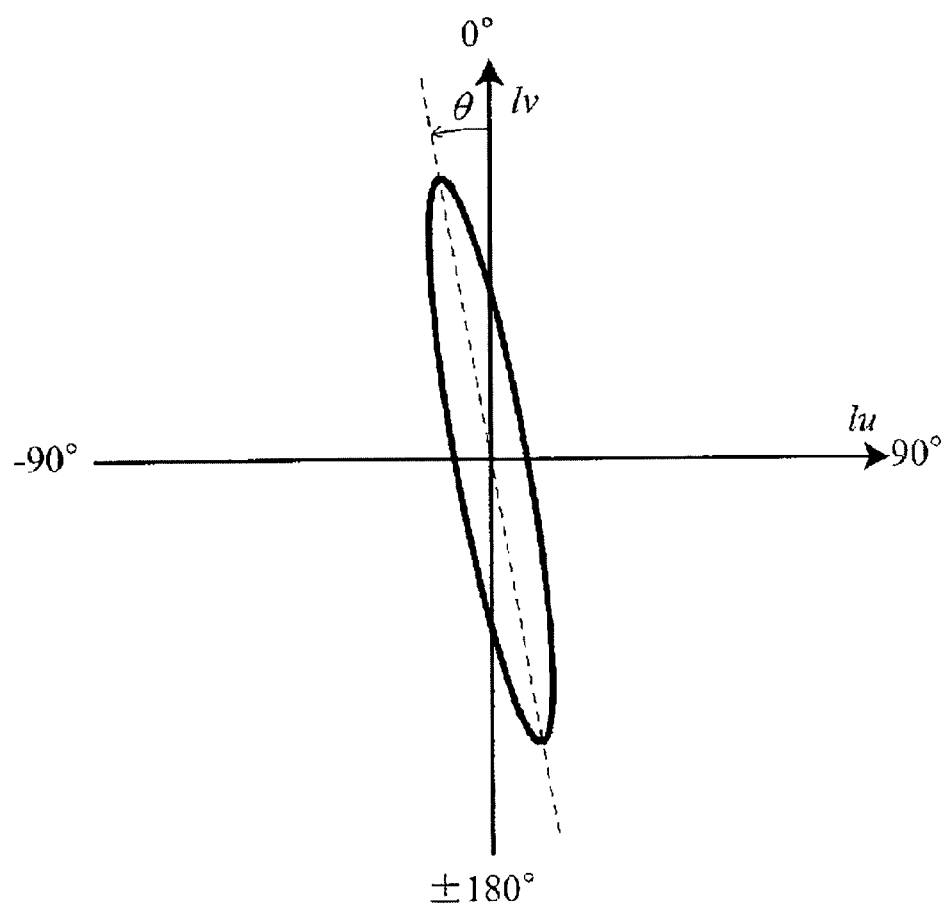
FIG. 4 is a diagram illustrating a direction of an off-axis astigmatism.

A direction $\angle A1(\tau)$ of the off-axial astigmatism is reflected to the direction of the ellipses formed by the iso-intensity lines of the local autocorrelation functions. As shown in FIG. 4, when an angle formed by a long axis of the ellipse on the over-focus side and the lv axis is represented as θ, Formula (2) is obtained.

$$\angle A_1(\tau) = \theta$$ [Formula 2]

Further, deviation from the exact focus in each local area before the through-focusing (in the initial state), that is, the off-axial defocus $C1(\tau)$ is given by Formula (3).

$$C_1(\tau) = -\frac{1}{2}(\Delta f_1 + \Delta f_2)$$ [Formula 3]

In the present embodiment, with respect to the through-focused Ronchigram, by fitting the iso-intensity lines of the local autocorrelation functions using the ellipses and detecting the focus amounts f1 and f2 in the line focus where the ellipse extends furthest and the inclination θ of the long axis of the ellipse in f2, the off-axial defocus and the off-axial astigmatism are calculated. The off-axial defocus and the off-axial astigmatism are expressed by Formula (4) and Formula (5) using on-axial aberration coefficients.

$$C_1(\tau) = C_1 + 2(B_2\tau^* + B_2^*\tau) + 2C_3|\tau|^2 + 3(S_3\tau^{*2} + S_3^*\tau^2) +$$ [Formula 4]
$$6|\tau|^2(B_A\tau^* + B_A^*\tau) + 4(D_4\tau^{*3} + D_4^*\tau^3) +$$
$$3C_5|\tau|^4 + 8|\tau|^2(S_5\tau^{*2} + S_5^*\tau^2) + 5(R_5\tau^{*4} + R_5^*\tau^4)$$

$$A_1(\tau) = A_1 + 2B_2\tau + 2A_2\tau^* + C_3\tau^2 + 6S_3\tau\,|^2$$ [Formula 5]
$$+ 3A_3\tau^{*2} + 2(3B_A|\tau|^2\tau + B_A^*\tau^3) + 12D_4\tau\,|^2$$
$$\tau^* + 4A_4\tau^{*3} + 2C_5|\tau|^2\tau^2 + 5A_5\tau^{*4} +$$
$$2(6S_5|\tau|^4 + S_5^*\tau^4) + 20R_5|\tau|^2\tau^{*2\cdot 2}$$

Here, fifth-order or lower-order aberrations are considered as the on-axial aberration coefficients (B4: two-fold symmetric fourth-order coma aberration, D4: three-fold symmetric fourth-order trefoil aberration, A4: five-fold symmetric fourth-order astigmatism, C5: fifth-order spherical aberration, A5: six-fold symmetric fifth-order astigmatism, S5: two-fold symmetric fifth-order stellar aberration, R5: four-fold symmetric fifth-order Rosetta aberration). By establishing simultaneous equations relating to the off-axial defocus and the off-axial astigmatism with respect to each local area, it is possible to calculate the on-axial aberration coefficient by a least squares method.

Hereinafter, an operation sequence of the automatic aberration correction device 17 will be described with reference to a flowchart of FIGS. 5A and 5B. Here, C1, A1, and B2 are used as automatic correction targets. First, a through-focus range T and a focus pitch width $\Delta f$ are set (F1). T is set to interpose line focuses on the under-focus side and on the over-focus side. According to this setting, the number of images captured through the through-focus becomes T/$\Delta f$+1.

Next, a Ronchigram 1 in an initial state is obtained (F2). Subsequently, a Ronchigram 2 in which the focus is changed by −n$\Delta f$ (n≡T/(2$\Delta f$) is obtained (F3). Further, a correlation value of the Ronchigram 1 and the Ronchigram 2 is calculated (F4). If the Ronchigrams 1 and 2 are obtained in a region where a specimen is not present, the correlation value becomes large since image contrast is hardly changed.

Accordingly, the correlation value is compared with a certain threshold value R (F5). If the correlation value is larger than R, correction is finished. If the correlation value is smaller than R, a local autocorrelation function of the Ronchigram 1 is calculated (F6), and a total sum of the areas of fitting ellipses is calculated (F7).

FIG. 6 shows examples of Ronchigrams, local autocorrelation functions, and a total sum of the areas of fitting ellipses of the local autocorrelation functions. An upper diagram in FIG. 6A shows an example in which an obtained Ronchigram is divided into local areas. A lower diagram shows an example in which a total sum of the areas of fitting ellipses is calculated in each divided area. An upper diagram and a lower diagram in FIG. 6B have the same relationship. Here, setting of the local areas of the Ronchigram is associated with the order of an aberration to be corrected. That is, a lower-order aberration is shown in a central portion of the Ronchigram, and a higher-order aberration is shown in a peripheral portion spaced from the central portion of the Ronchigram. Accordingly, it is possible to adjust the type (order) of an aberration capable of being corrected according to the setting method of the local areas.

Figure 6A:
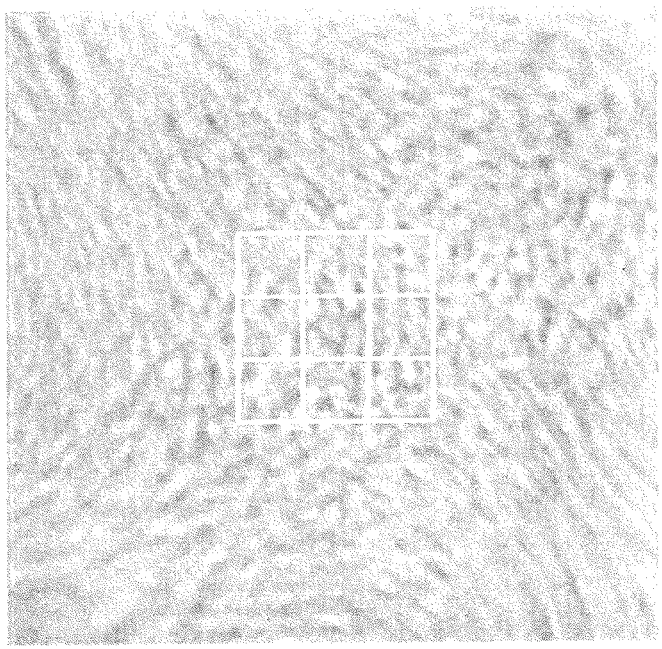
FIG. 6A is a diagram illustrating a calculation example of a total sum of the areas of fitting ellipses of local autocorrelation functions.
Figure 6A:
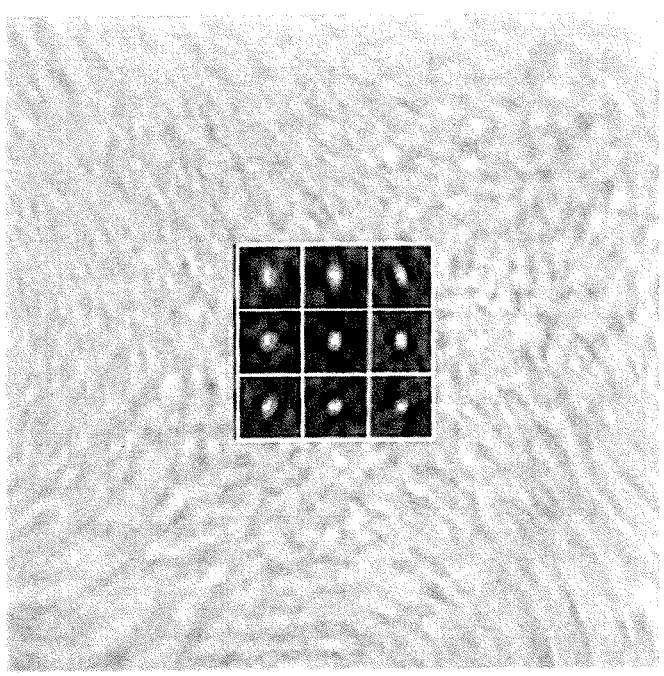
Figure 6B:
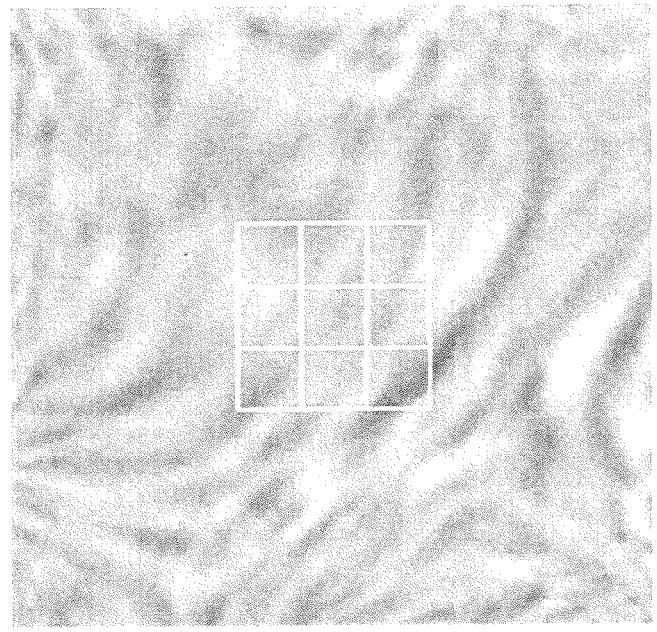
FIG. 6B is a diagram illustrating a calculation example of a total sum of the areas of fitting ellipses of local autocorrelation functions.
Figure 6B:
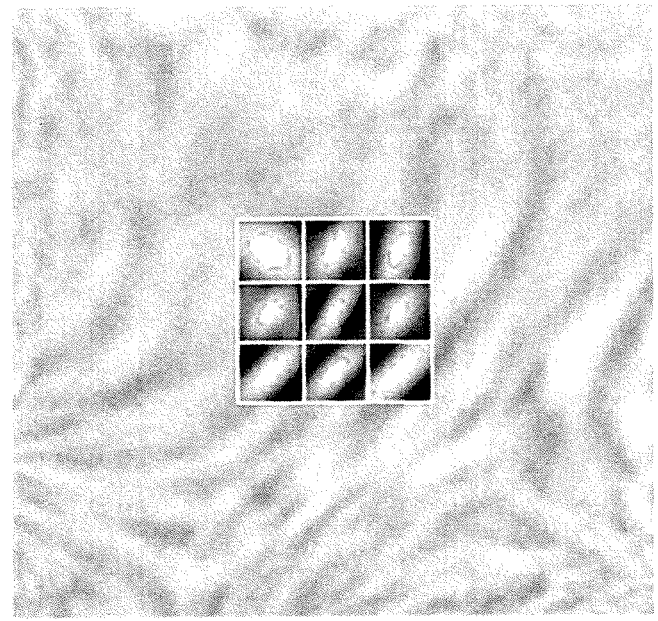

FIG. 6A shows a case where A1 and B2 are large, and FIG. 6B shows a case where A1 and B2 are small. The total sum of areas of fitting ellipses in FIG. 6A is about 1/10 with respect to the total sum of areas of fitting ellipses in FIG. 6B.

Further, an arbitrary threshold value S is set with respect to the total sum of areas, and when the total sum of areas is larger than S, the correction is finished. For example, when a value between the total sum of areas in the lower diagram of FIG. 6A and the total sum of areas in the lower diagram of FIG. 6B is set as the threshold value S, it is determined that the correction is necessary according to the invention since the area is smaller than the threshold value S in the case of the lower diagram of FIG. 6A, but it is determined that the correction is not necessary since the area is larger than the threshold value S in the case of the lower diagram of FIG. 6B.

Accordingly, when the total sum of areas is smaller than S, the focus is changed by $\Delta f$ until the focus reaches $n\Delta f$ to obtain the Ronchigrams, local autocorrelation functions thereof are calculated, and then, the focus is returned to the initial state (F9 to F12). A line focus where the fitting ellipse extends furthest is respectively detected for each local area on the under-focus side and the over-focus side from the local autocorrelation functions of the through-focused Ronchigrams obtained in F2 to F12 (F13).

As a method of detecting the line focus, for example, a method of using the circularity of a fitting ellipse is considered. When a radius (long diameter) of the fitting ellipse in a long axis direction is represented as "a" and a radius (short diameter) thereof in a short axis direction is represented as "b", the circularity R is given by Formula (6).

$$R=2(a \times b)/(a^2+b^2) \quad \text{[Formula 6]}$$

R becomes a maximum value of 1 in the case of a perfect circle, and becomes small as the ellipse is deviated from the perfect circle. Accordingly, when a graph is drawn in which a focus amount is represented on a transverse axis and R is represented on a longitudinal axis, minimum points in the graph seen on the under-focus side and the over-focus side form the line focus.

Figure 7A:
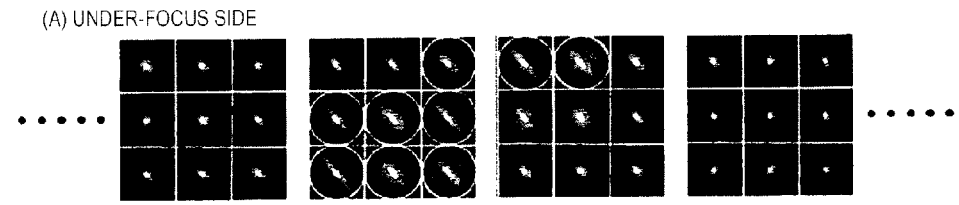
FIG. 7A is a diagram illustrating an example of line focus detection on an under-focus side.
Figure 7B:
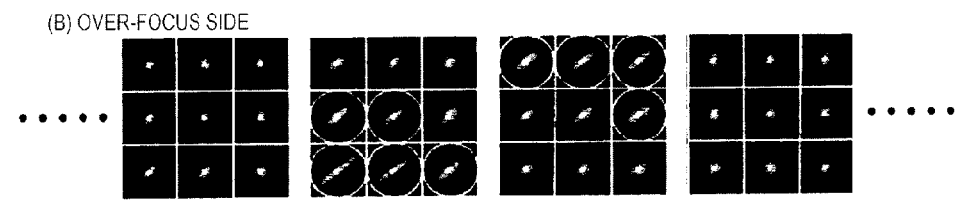
FIG. 7B is a diagram illustrating an example of line focus detection on an over-focus side.

FIGS. 7A and 7B show detection examples of line focuses. Portions surrounded by circles in FIG. 7 represent line focuses, which are detected in second and third conditions from the left on the under-focus side in FIG. 7A, and are also detected in second and third conditions from the left on the over-focus side in FIG. 7B. Here, since the detection of the line focus is performed by comparing the relative extensions of the fitting ellipses having different focuses for each local area, it is not necessary for the condition of the detected line focus to be a true value.

Figure 8:
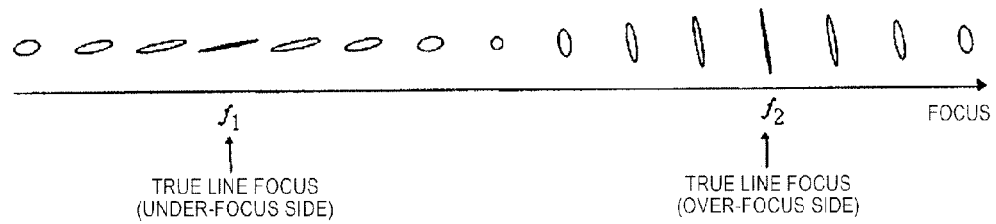
FIG. 8 is a diagram illustrating comparison of detection accuracies of line focuses due to a difference of focus pitch widths.
Figure 8:
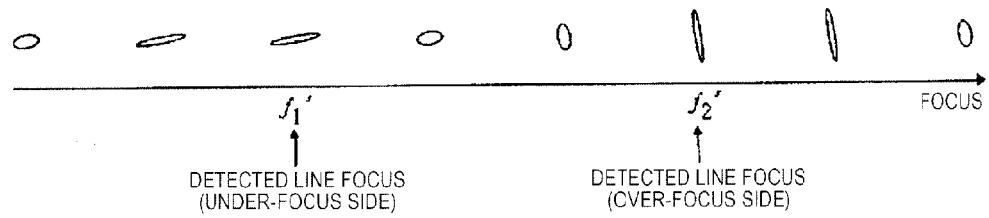

For example, as shown in FIG. 8(A), if the focus pitch width $\Delta f$ when the through-focusing is performed is sufficiently small, the true line focuses f1 and f2 where the fitting ellipse extends furthest can be detected, but as shown in FIG. 8(B), line focuses f1' and f2' detected when the focus pitch width $\Delta f$ is large are deviated from the true values. Accordingly, $|A1(\tau)|$ and $C1(\tau)$ calculated from Formula (1) and Formula (3) become approximate values where their accuracies are determined by $\Delta f$.

Hereinbefore, the method of using the local autocorrelation function is shown in F6 to F13, but instead, an absolute value of a Fourier transform in the local area may be used. Since values to be currently calculated are C1, A1, and B2, assuming that $\tau$ is small, Formula (7) and Formula (8) obtained by approximating Formula (4) and Formula (5) are used.

$$C_1(\tau) \approx C_1 + 2(B_2\tau^* + B_2^*\tau) \quad \text{[Formula 7]}$$

$$A_1(\tau) \approx A_1 + 2B_2\tau + 2A_2\tau^* \quad \text{[Formula 8]}$$

With respect to seven unknown quantities of C1, a real part ReA1 and an imaginary part ImA1 of A1, a real part ReB2 and an imaginary part ImB2 of B2, and a real part ReA2 and an imaginary part ImA2 of A2, since three equations relating to a real part and an imaginary part of Formula (7) and Formula (8) are formed with respect to each local area, it is necessary to detect the line focus in at least three local areas (F14). If there is no detection, the line focus is emphasized by introducing A1, and the through-focus range T is relatively increased (F15) to detect the line focus again.

Figure 9:
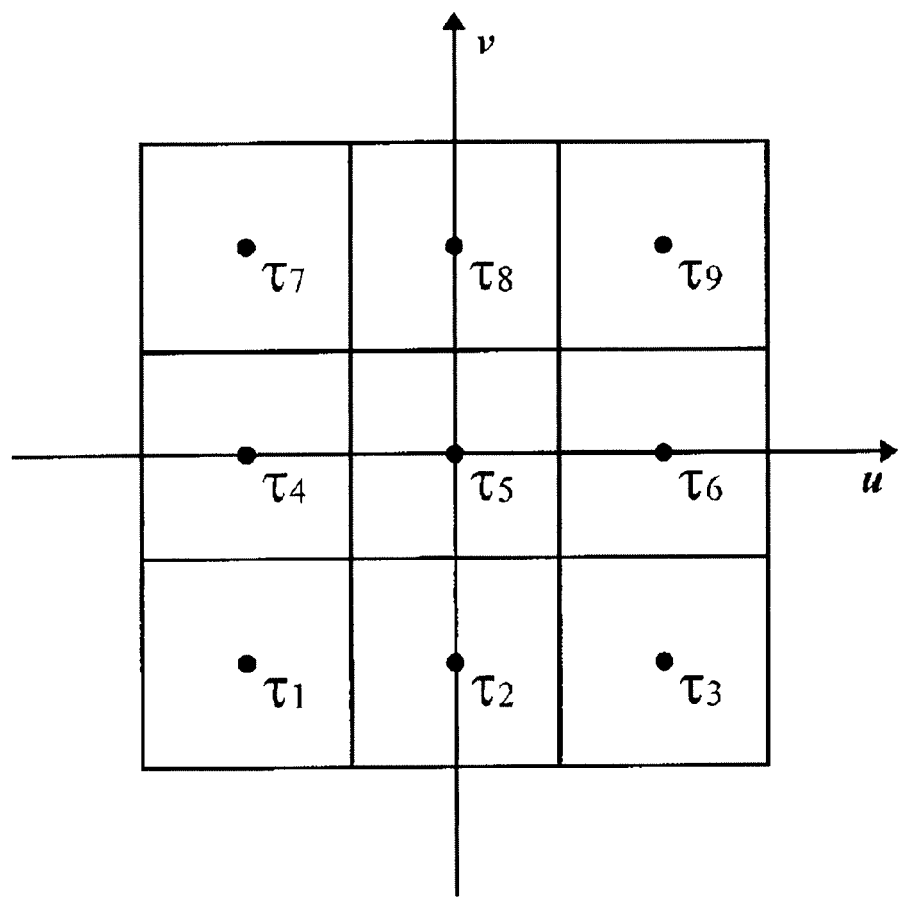
FIG. 9 is a diagram illustrating an example of a method of taking central coordinates in a local area.

When the line focus is detected in three or more local areas, $C1(\tau)$ and $A1(\tau)$ ($|A1(\tau)|$ and $\angle A1(\tau)$) in each local area are calculated using Formulas (1) to (3) (F16). Here, when the central coordinates $\tau$ in the local areas are taken as shown in FIG. 9, a simultaneous equation to be solved becomes Formula (9).

$$\begin{pmatrix} 1 & 0 & 0 & 4u_1 & 4v_1 & 0 & 0 \\ 0 & 1 & 0 & 2u_1 & -2v_1 & 2u_1 & -2v_1 \\ 0 & 0 & 1 & 2v_1 & 2u_1 & -2v_1 & 2u_1 \\ 1 & 0 & 0 & 4u_2 & 4v_2 & 0 & 0 \\ 0 & 1 & 0 & 2u_2 & -2v_2 & 2u_2 & -2v_2 \\ 0 & 0 & 1 & 2v_2 & 2u_2 & -2v_2 & 2u_2 \\ \vdots & \vdots & \vdots & \vdots & \vdots & \vdots & \vdots \\ 1 & 0 & 0 & 4u_9 & 4v_9 & 0 & 0 \\ 0 & 1 & 0 & 2u_9 & -2v_9 & 2u_9 & -2v_9 \\ 0 & 0 & 1 & 2v_9 & 2u_9 & -2v_9 & 2u_9 \end{pmatrix} \times \begin{pmatrix} C_1 \\ ReA_1 \\ ImA_1 \\ ReB_2 \\ ImB_2 \\ ReA_2 \\ ImA_2 \end{pmatrix} = \begin{pmatrix} C_1(\tau_1) \\ ReA_1(\tau_1) \\ ImA_1(\tau_1) \\ C_1(\tau_2) \\ ReA_1(\tau_2) \\ ImA_1(\tau_2) \\ \vdots \\ C_1(\tau_9) \\ ReA_1(\tau_9) \\ ImA_1(\tau_9) \end{pmatrix}$$

[Formula 9]

Here, $ReA_1(\tau)$ and $ImA_1(\tau)$ are calculated by Formula (10) and Formula (11) from $|A_1(\tau)|$ and $\angle A_1(\tau)=\theta$.

$$ReA_1(\tau)=|A_1(\tau)|\cos[2\theta] \quad \text{[Formula 10]}$$

$$ImA_1(\tau)=|A_1(\tau)|\sin[2\theta] \quad \text{[Formula 11]}$$

Formula (9) is solved by a least squares method (F17), and the sizes of A1 and B2 are compared with target values (F18). If the sizes are smaller than the target values, the correction is finished, but if the sizes are larger than the target values, C1, A1, and B2 are corrected (F19).

In this way, F2 to F19 are repeated until A1 and B2 become smaller than the target values, but by reducing the through-focus range T and the focus pitch width Δf (F20) every repetition, the detection accuracy of the line focus and the measurement accuracy of the aberration coefficient increase. As a method of determining the through-focus range T, for example, a method of calculating $A_1(\tau)$ with respect to each local area from Formula (8) using A1, B2, and A2 calculated by the least squares method and setting T to two times a maximum value among the calculated values of $A_1(\tau)$ may be considered.

In this method, it can be expected that an astigmatic difference before A1 and B2 are corrected in (F19) becomes a maximum value and an astigmatic difference after the correction becomes smaller than the maximum value. It is necessary to determine the focus pitch width Δf while considering the measurement time and the measurement accuracy, but for example, a method for setting Δf to 1/10 of T may be considered.

Further, as described above, since three equations relating to the calculated unknown quantities are established, it is necessary to detect the line focus in three or more local areas. Accordingly, since the number of necessary equations is changed according to the type of aberration to be calculated, the detection of the line focus in three or more local areas is not essential.

Figure 5A:
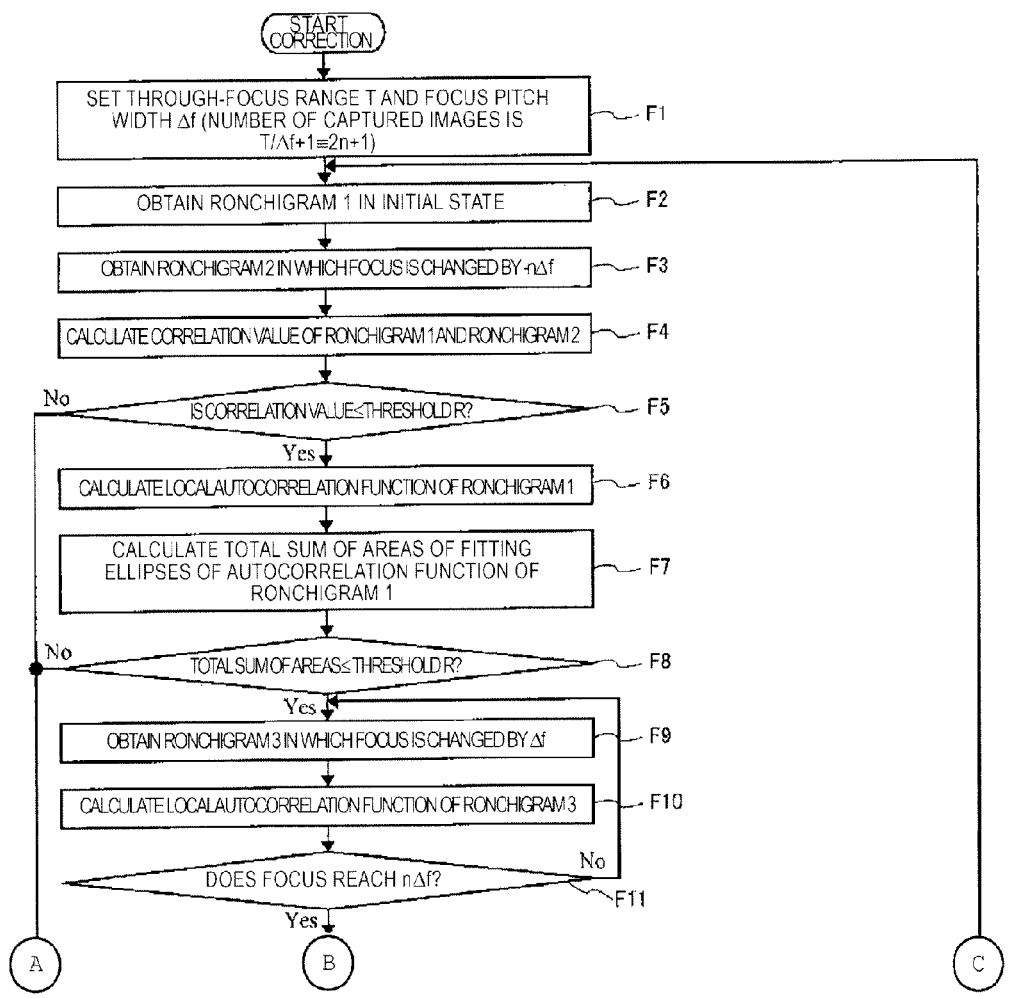
FIGS. 5A and 5B are flowcharts illustrating a procedure of automatic correction of C1, A1, and B2.
Figure 5B:
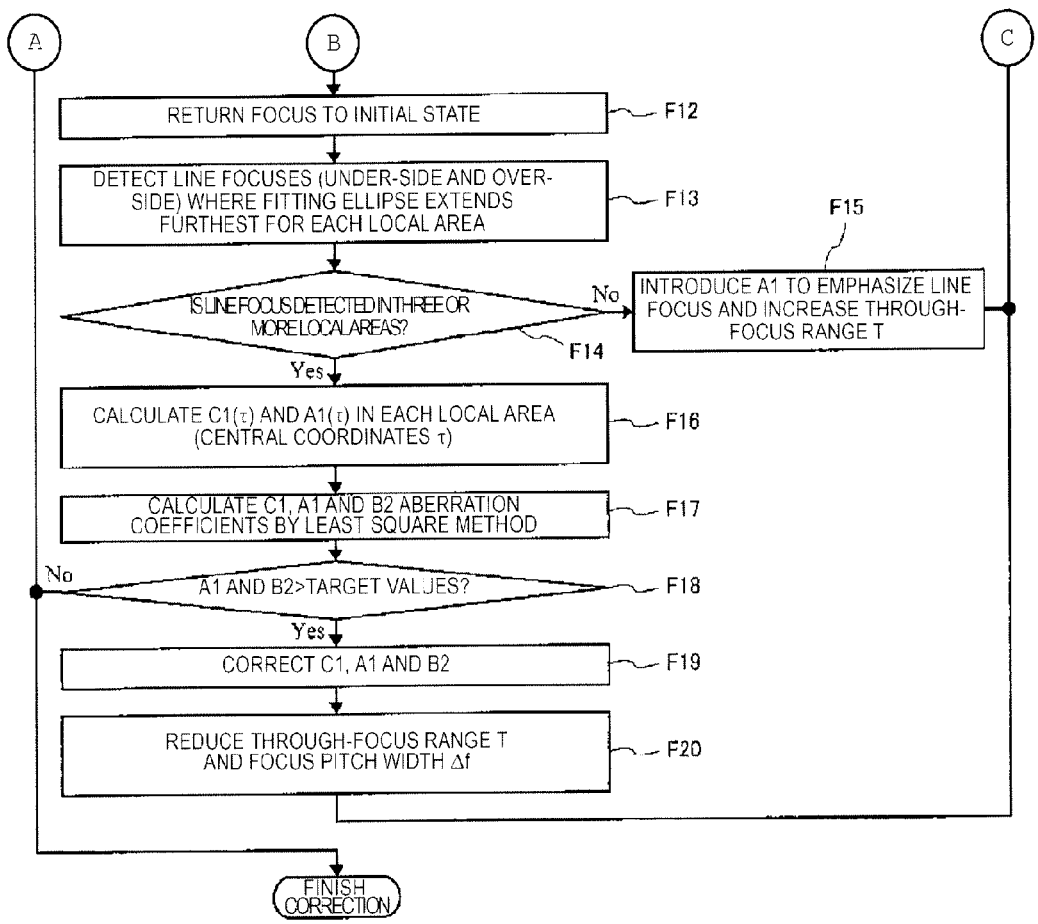

Here, with reference to the correspondences of FIG. 1 and FIGS. 5A and 5B, the through-focus imaging unit 18 corresponds to F2, F3, F9, F11, and F12, the input image validity determination unit 19 corresponds to F4, and F5, the correction necessity determination unit 20 corresponds to F6 to F8, the off-axial aberration calculation unit 21 corresponds to F10, and F13 to F16, the on-axial aberration calculation unit 22 corresponds to F17 and F18, the correction control amount calculation unit 23, the conversion coefficient table 24 and the control unit 26 correspond to F19, and the optimal focus range calculation unit 25 corresponds to F20, respectively. F1 is performed by a user through the input and output unit 15, but may be omitted by using preset defined values.

Figure 10:
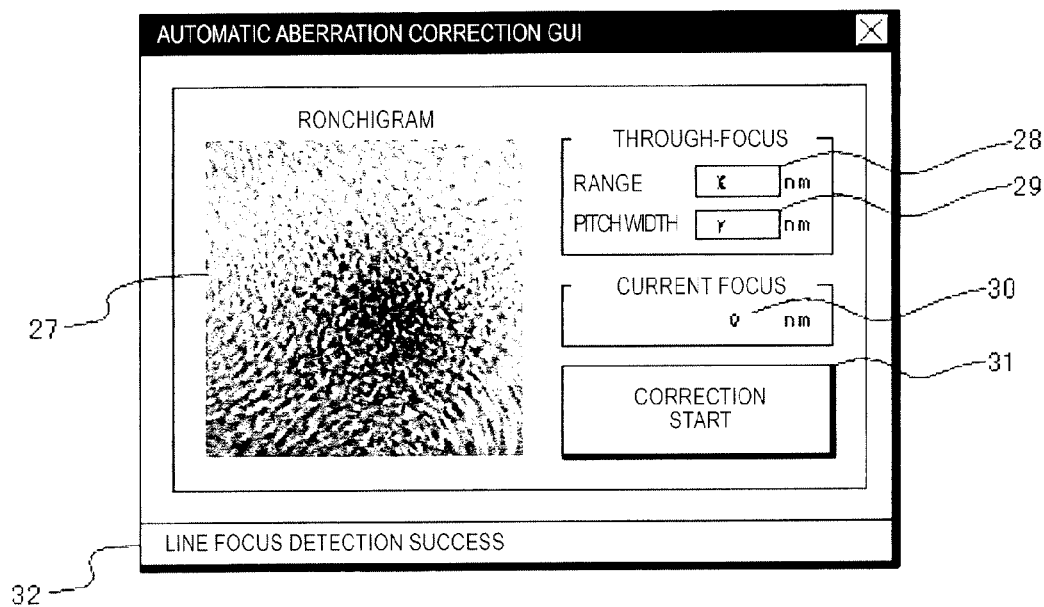
FIG. 10 is a diagram illustrating an example of GUI that executes automatic aberration correction.

FIG. 10 shows an example of an automatic aberration correction GUI. Hereinafter, a method for performing automatic correction using the GUI will be described. First, the through-focus range T is set using a through-focus range setting text box 28, and the focus pitch width Δf is set using a focus pitch width text box 29.

Then, by pressing a correction start button 31, F2 to F20 in FIG. 5B are automatically performed. Captured Ronchigrams are displayed in a Ronchigram display 27 in FIG. 10, and a focus value at this time is displayed in a focus display label 30. A status indicating whether the detection of the line focus is successful is displayed in a status bar 32.

In the flowchart of FIGS. 5A and 5B, Formula (7) and Formula (8) are used with respect to the off-axial defocus and the off-axial astigmatism using C1, A1, and B2 as the correction targets, but by further calculating the off-axial defocus and the off-axial astigmatism with respect to a local area where τ is large using Formula (4) and Formula (5) in which the aberrations up to the fifth-order are considered, or an equation in which aberrations up to a further higher-order are considered, the invention may also be applied to measurement of higher-order aberrations. Further, the invention is used as effective means for correcting A1 and B2 having large values that are not easily measured by the related art technique, but contrarily, even when A1 and B2 are extremely small so that final fine adjustment is performed, the invention can solve the problem by reducing the focus pitch width Δf. That is, first, the invention may be used in order to correct large aberration amounts (A1 and B2), and then, final fine adjustment may be performed using another aberration correction device or method after the aberrations become small to a certain degree, for example. In this way, plural devices or methods may be combined as necessary. Further, as described above, the processes to the final fine adjustment may be performed by a single aberration correction device or method.

Hereinbefore, one embodiment of the invention has been described as an example of the scanning transmission electron microscope, but the invention may be applied to another charged-particle-beam device provided with Ronchigram observation means, for example, a transmission electron microscope.

According to the invention, by extracting characteristic amounts of aberrations from plural Ronchigrams obtained by through-focusing, it is possible to perform automatic aberration correction even in a state where A1 and B2 having large values that are not easily measured by the related art technique remain.

REFERENCE SIGNS LIST

1 Electron Beam Source
2 Electron Beam
3, 4 Irradiation Lens
5 Adjusting Lens
6 Abberration Corrector
7 Transfer Lens
8 Scanning Coil
9 Objective Lens
10 Specimen
11 Projection Lens
12 Dark Field Image Detector
13 Camera
14 Dark Field Image Observation Unit
15 Input and Output Unit
16 Ronchigram Observation Unit
17 Automatic Aberration Correction Device
18 Through-Focus Imaging Unit
19 Input Image Validity Determination Unit
20 Correction Necessity Determination Unit
21 Off-Axial Aberration Calculation Unit
22 On-Axial Aberration Calculation Unit
23 Correction Control Amount Calculation Unit
24 Conversion Coefficient Table
25 Optimal Focus Range Calculation Unit
26 Control Unit
27 Ronichigram Display
28 Through-Focus Range Setting Text Box
29 Focus Pitch Width Text Box
30 Focus Display Label
31 Correction Start Button
32 Status Bar

The invention claimed is:

1. A charged-particle-beam device comprising:
a charged-particle-beam source;
a charged-particle optical system that irradiates a specimen with charged particles emitted from the charged-particle-beam source;
an aberration corrector that corrects an aberration of the charged-particle optical system;
a control unit that controls the charged-particle optical system and the aberration corrector; and
an aberration correction device, including:
a through-focus imaging unit that obtains a plurality of Ronchigrams in which a focal position of the charged-particle optical system is changed,
a first aberration calculation unit that divides each of the obtained Ronchigrams into a plurality of local areas, detects a line focus for each local area, and calculates an off-axial defocus and an off-axial astigmatism for each local area based on the detected line focus,
a second aberration calculation unit that calculates on-axial aberration coefficients using a least squares method to solve a set of simultaneous equations relating to the off-axial defocus and the off-axial astigmatism for each local area, and
a correction control amount calculation unit that calculates a control amount for the optical system to correct the aberration based on the on-axial aberration coefficients, and outputs the control amount to the control unit.

2. The charged-particle-beam device according to claim 1, wherein the first aberration calculation unit fits iso-intensity lines in the local areas using ellipses and detects the line focuses based on the ellipses for the fitting.

3. The charged-particle-beam device according to claim 2, wherein the iso-intensity lines in the local areas are calculated by an autocorrelation function or Fourier transform.

4. The charged-particle-beam device according to claim 1, further comprising:
an input unit through which a setting value is input,
wherein the through-focus imaging unit changes the focal position in a range based on the input setting value.

5. The charged-particle-beam device according to claim 4, wherein the line focuses are detected in the local areas of each obtained Ronchigram on an under-focus side and on an over-focus side, and
the through-focus imaging unit obtains a plurality of Ronchigrams when the focal position is changed in a range larger than the range based on the input setting value, when the line focuses detected in the local areas are smaller than a defined value.

6. The charged-particle-beam device according to claim 1, wherein the charged-particle-beam optical system includes an objective lens that focuses the charged particles on the specimen, and
the plurality of local areas includes a first local area corresponding to a first electron beam flux that passes through the vicinity of an on-axis in the charged-particle-beam optical system, and a second local area corresponding to a second electron beam flux that passes through an outer side of the objective lens with reference to the first electron beam flux.

7. A charged-particle-beam device comprising:
a charged-particle-beam source;
a charged-particle optical system that irradiates a specimen with charged particles emitted from the charged-particle-beam source;
an aberration corrector that corrects an aberration of the charged-particle optical system;
a control unit that controls the charged-particle optical system and the aberration corrector;
an input unit through which a setting value is input;
an aberration correction device, including:
a through-focus imaging unit that obtains a plurality of Ronchigrams in which a focal position of the charged-particle optical system is changed based on the setting value,
a first aberration calculation unit that divides each of the obtained Ronchigrams into a plurality of local areas, detects a line focus for each local area, and calculates an off-axial defocus and an off-axial astigmatism for each local area based on the detected line focus,
a second aberration calculation unit that calculates on-axial aberration coefficients using a least squares method to solve a set of simultaneous equations relating to the off-axial defocus and the off-axial astigmatism for each local area, and
a correction control amount calculation unit that calculates a control amount for the optical system to correct the aberration based on the on-axial aberration coefficients, and outputs the control amount to the control unit;
a correction start input unit that receives a start input of an operation of obtaining the plurality of Ronchigrams by the through-focus imaging unit; and
a status display that displays whether detection of line focuses is successful based on the obtained Ronchigrams,
wherein when the detection of the line focuses is not performed, the aberration corrector transmits an instruction for requesting an input of a setting value again to the input unit, or transmits an instruction for obtaining the plurality of Ronchigrams in which the focal position is changed in a range larger than the range where the focal position is changed to the through-focus imaging unit.

8. A method for correcting an aberration in a charged-particle-beam device that includes a charged-particle-beam source, a charged-particle optical system that irradiates a specimen with charged particles emitted from the charged-particle-beam source, an aberration corrector that corrects the aberration of the charged-particle optical system, an aberration correction device, and a control unit that controls the charged-particle optical system and the aberration corrector, the method comprising:
obtaining a plurality of Ronchigrams in which a focal position of the charged-particle optical system is changed;
dividing the obtained Ronchigram into a plurality of local areas;
calculating the amount of the aberration based on line focuses detected in the local areas, including:
detecting a line focus for each local area,
calculating an off-axial defocus and an off-axial astigmatism for each local area based on the detected line focus,
calculating on-axial aberration coefficients using a least squares method to solve a set of simultaneous equations relating to the off-axial defocus and the off-axial astigmatism for each local area; and calculating a control amount for the optical system to correct the aberration based on the on-axial aberration coefficients.

9. The method for correcting the aberration according to claim 8, wherein calculating the amount of the aberration includes a fitting iso-intensity lines in the local areas using ellipses, and detecting the line focuses based on the ellipses for the fitting.

10. The method for correcting the aberration according to claim 9, wherein the iso-intensity lines in the local areas are calculated by an autocorrelation function or Fourier transform.

11. The method for correcting the aberration according to claim 8, further comprising:

inputting a setting value to be used in the first step, wherein obtaining a plurality of Ronchigrams changes the focal position in a range based on the input setting value.

12. The method for correcting aberration according to claim 11, wherein detecting the line focus for each local area includes detecting the line focuses in the local areas of each obtained Ronchigram on an under-focus side and an over-focus side, and the method further comprises:

obtaining, when the line focuses detected in the local areas are smaller than a defined value, the plurality of Ronchigrams in which the focal position is changed in a range larger than the range based on the input setting value.

* * * * *